United States Patent
Edet et al.

(10) Patent No.: US 9,692,160 B2
(45) Date of Patent: Jun. 27, 2017

(54) ELECTRICAL CONNECTOR

(71) Applicant: STMicroelectronics (Tours) SAS, Tours (FR)

(72) Inventors: Arnaud Edet, Tours (FR); Christian Nopper, Savonnieres (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 14/956,202

(22) Filed: Dec. 1, 2015

(65) Prior Publication Data

US 2016/0294088 A1 Oct. 6, 2016

(30) Foreign Application Priority Data

Apr. 3, 2015 (FR) ...................................... 15 52910

(51) Int. Cl.

| | |
|---|---|
| *H01R 12/00* | (2006.01) |
| *H01R 12/71* | (2011.01) |
| *H05K 1/14* | (2006.01) |
| *H01R 13/66* | (2006.01) |
| *H05K 1/02* | (2006.01) |
| *H05K 1/18* | (2006.01) |

(52) U.S. Cl.
CPC ........... *H01R 12/71* (2013.01); *H01R 13/665* (2013.01); *H05K 1/14* (2013.01); *H01R 12/716* (2013.01); *H05K 1/0298* (2013.01); *H05K 1/185* (2013.01); *H05K 2201/047* (2013.01)

(58) Field of Classification Search
CPC ........ H01R 12/52; H01R 12/73; H01R 13/24; H01R 12/79; H01R 12/71; H01R 12/737
USPC ....................................................... 439/65, 67
See application file for complete search history.

(56) References Cited

U.S. PATENT DOCUMENTS

| | | | |
|---|---|---|---|
| 3,998,512 A | 12/1976 | Anhalt et al. | |
| 5,626,483 A | 5/1997 | Naitoh | |
| 5,727,956 A * | 3/1998 | Mitra | H01R 13/035 439/74 |
| 6,132,224 A * | 10/2000 | Murakami | H05K 1/118 439/260 |
| 6,375,512 B1 * | 4/2002 | Zito | H01R 13/035 439/660 |
| 2005/0184381 A1 | 8/2005 | Asahi et al. | |
| 2009/0163045 A1 | 6/2009 | Peloza et al. | |

OTHER PUBLICATIONS

INPI Search Report and Written Opinion for FR 1552910 dated Jan. 19, 2016 (7 pages).

\* cited by examiner

*Primary Examiner* — Xuong Chung Trans
(74) *Attorney, Agent, or Firm* — Gardere Wynne Sewell LLP

(57) ABSTRACT

An electrical connector includes a frame delimiting an elongated open cavity, and having two parallel long sides provided with contact areas capable of cooperating with contact areas of a complementary electrical connector. Each long side is formed of a multilayer printed circuit board.

24 Claims, 3 Drawing Sheets

ELECTRICAL CONNECTOR

PRIORITY CLAIM

This application claims the priority benefit of French Patent application number 1552910, filed on Apr. 3, 2015, the content of which is hereby incorporated by reference in its entirety to the maximum extent allowable by law.

TECHNICAL FIELD

The present disclosure relates to the field of electrical connectors used in electronic devices, particularly in mobile electronic devices such a laptop computers, tablets, or cell phones.

BACKGROUND

Many electronic devices, particularly mobile electronic devices, comprise one or a plurality of printed circuits boards and user interfaces such as keyboards, screens, microphones, or cameras. To electrically interconnect boards and user interfaces, electrical connectors generally associated with flexible connection strips having conductive tracks formed thereon are used. Each connector comprises a first element assembled on a printed circuit board or on a user interface, and a complementary element connected to a connection strip. Components are currently mounted on the printed circuit board or the user interface, around the first connector element, to associate certain functions with the connector. For example, in the case of a connector used in a cell phone, these components may be common-mode filters.

In practice, the elements of a connector comprising metal strips are manufactured from a block or an electrically-insulating frame, for example, made of thermoformed plastic, having metal strips placed thereon. The space separating two adjacent strips and the strip width are then imposed by mechanical considerations. Currently, the metal strips have a width of at least 100 µm, and two adjacent strips are separated by at least 150 µm. Thus, due to the fact that the dimensions of the strips and the space separating two adjacent strips are difficult to decrease, the dimensions of a connector element are difficult to decrease. Further, each contact strip is necessarily connected to a determined pad of the support having the connector element mounted thereon.

It would be desirable to have an electrical connector element particularly having the advantage of overcoming at least some of the disadvantages of an electrical connector element comprising metal strips.

SUMMARY

An embodiment of the present disclosure provides an electrical connector element of the type including a frame that delimits an elongated open cavity and is formed of two parallel long sides. Each parallel long side includes contact areas that are configured to contact corresponding contact areas of a complementary electrical connector element. Each parallel long side is formed of a multilayer printed circuit board.

According to an embodiment, at least one integrated circuit chip is arranged in a board of at least one of the long sides.

According to an embodiment, the frame includes two spacers that separate the long sides.

According to an embodiment, each spacer is a portion of a printed circuit board.

According to an embodiment, the connector element is configured to be assembled on a support that includes conductive pads where each of the two multilayer printed circuit boards includes connection areas that are configured to connect with the conductive pads.

According to an embodiment, the connection areas of each board have a rim at the level of the edge of the board configured to contact the support.

According to an embodiment, the external surface of each board comprises first connection areas, and the internal surface of each board comprises second connection areas. Each first connection area is disposed opposite a second connection area and is connected to that opposite second connection area by a through via.

According to an embodiment, the first through vias of each board are open at the level of the edge of the board configured to contact the support.

According to an embodiment, the frame is rectangular.

According to an embodiment, a plate closes the side of the frame configured to contact the support.

The foregoing and other features and advantages will be discussed in detail in the following non-limiting description of specific embodiments in connection with the accompanying drawings.

DETAILED DESCRIPTION

Figure 1A:
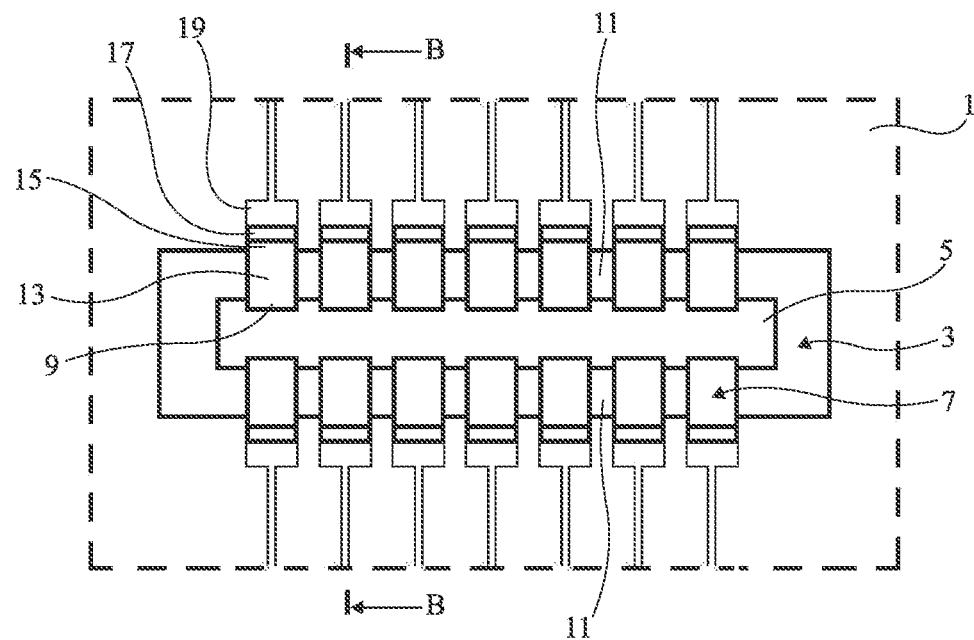
FIGS. 1A and 1B show an example of an electrical connector element comprising metal strips.

The same elements have been designated with the same reference numerals in the various drawings and, further, the various drawings are not to scale.

In the following description, terms such as "upper", "lower" refer to the orientation of the concerned elements in the corresponding drawings.

It is here provided to form an electrical connector element from multilayer printed circuit boards.

Figure 1B:
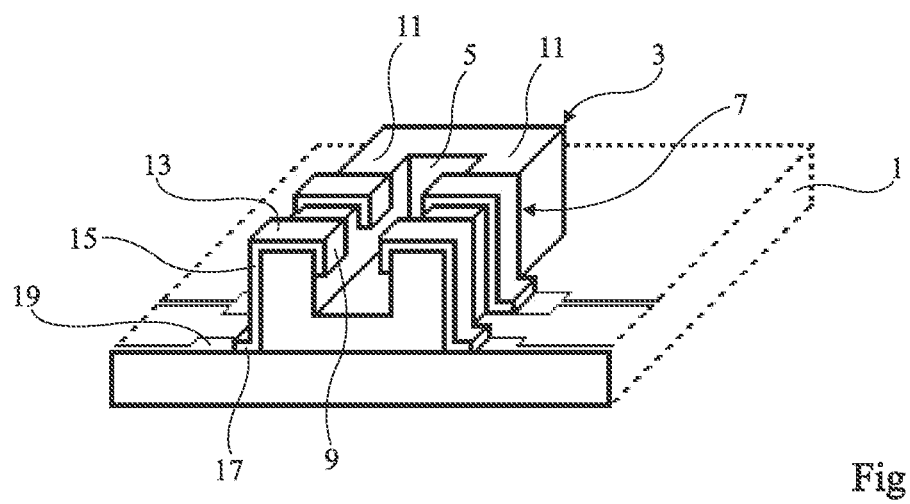

FIG. 1A is a top view of an example of an electrical connector element comprising metal strips. FIG. 1B is a perspective and cross-section view along plane B-B of FIG. 1A. In these drawings, the connector element is assembled on the upper surface of a printed circuit board 1.

The connector element comprises an electrically insulating rectangular frame 3 closed on the side of printed circuit board 1 and defining an elongated cavity 5. Regularly spaced apart parallel metal strips 7 are used as contacts. Each strip 7 successively comprises a portion 9 arranged on the internal surface of a long side 11 or frame 3, a portion 13 arranged on the upper edge of this long side 11, and a portion 15 arranged on the external surface of long side 11. In addition, a portion 17 extends from the portion 15 and rests on the printed circuit board 1 and is welded to a pad 19 of the board 1. At least portions 9 and 15 of each strip 7 form contact areas of the connector element.

Figure 2A:
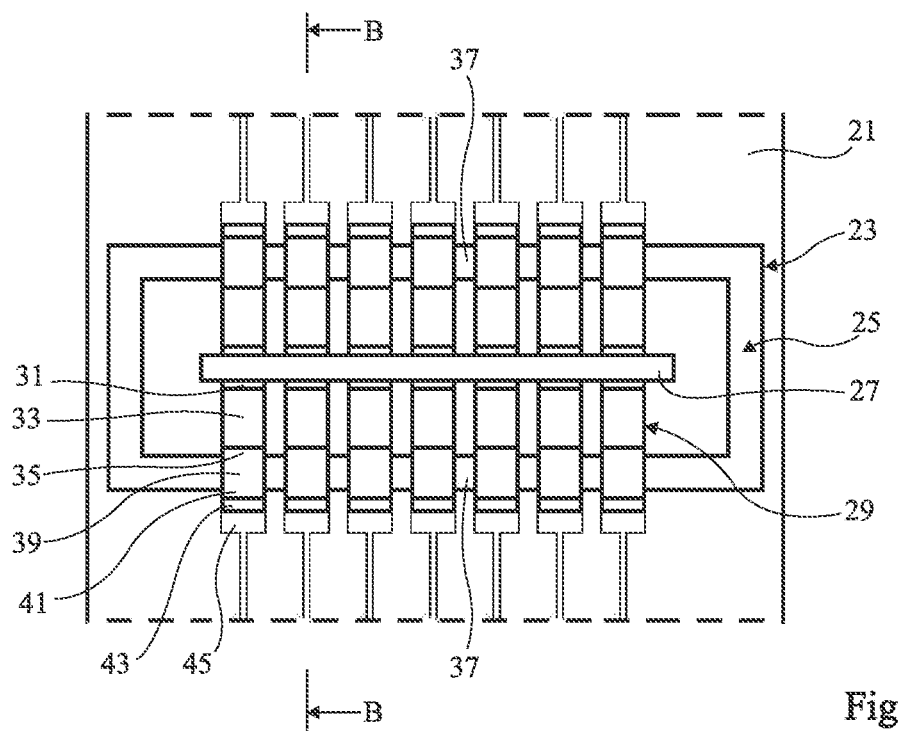
FIGS. 2A and 2B show an example of an electric connector element, complementary to that of FIGS. 1A and 1B.
Figure 2B:
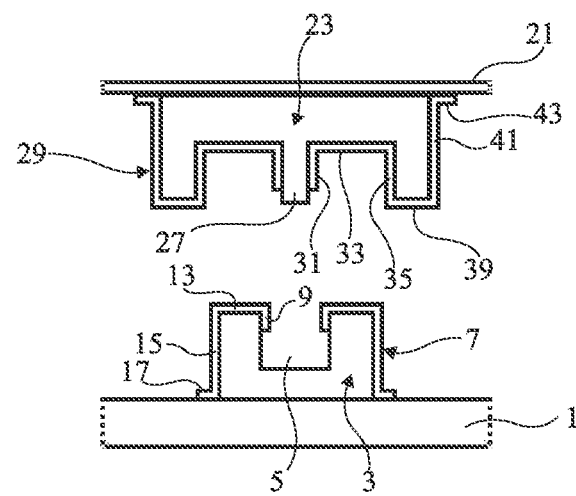

FIGS. 2A and 2B show an example of an electrical connector element comprising metal strips, complementary to that of FIGS. 1A and 1B. FIGS. 2A and 2B respectively are a bottom view and a cross-section view of the complementary connector element, FIG. 2B being a cross-section view along plane B-B of FIG. 2A. In these drawings, the complementary connector element is assembled on the lower surface of a connection strip 21. In FIG. 2B, the complementary connector element is shown opposite the connector element of FIGS. 1A and 1B.

The complementary connector element comprises an electrically-insulating block 23 formed of a rectangular frame 25 closed on the side of strip 21, and of an elongated protruding portion 27, surrounded with frame 25. Regularly spaced apart parallel metal strips 29 are used as contacts. Each strip 29 successively comprises a portion 31 arranged on a longitudinal lateral surface of protruding portion 27, a portion 33 arranged on block 23, a portion 35 arranged on the internal surface of a long side 37 of frame 25, a portion 39 arranged on the edge of this long side 31, and a portion 41 arranged on the external surface of long side 31. A portion 43 extends from the portion 41 and rests on the connection strip 21 and is welded to a pad 45 of the connection strip 21. At least portions 31 and 35 of each strip 29 form contact areas of the complementary connector.

A first element of an electrical connector with strips comprises the same number of metal strips as the complementary element, the positions of the strips being such that each strip of the first element of the connector has a corresponding strip of the complementary element. The dimensions of each of the two elements of the connector are such that the cavity of the first element of the connector can receive the protruding portion of the complementary element, and that the contact areas of the first element of the connector are then in contact with those of the complementary element. An example of a connector comprising metal strips where each strip of the first connector element is enclasped by each strip of the complementary connector element has been shown herein. Other connectors include metal strips where the complementary connector element simply has a protruding portion which inserts into the cavity of the first connector element.

Figure 3A:
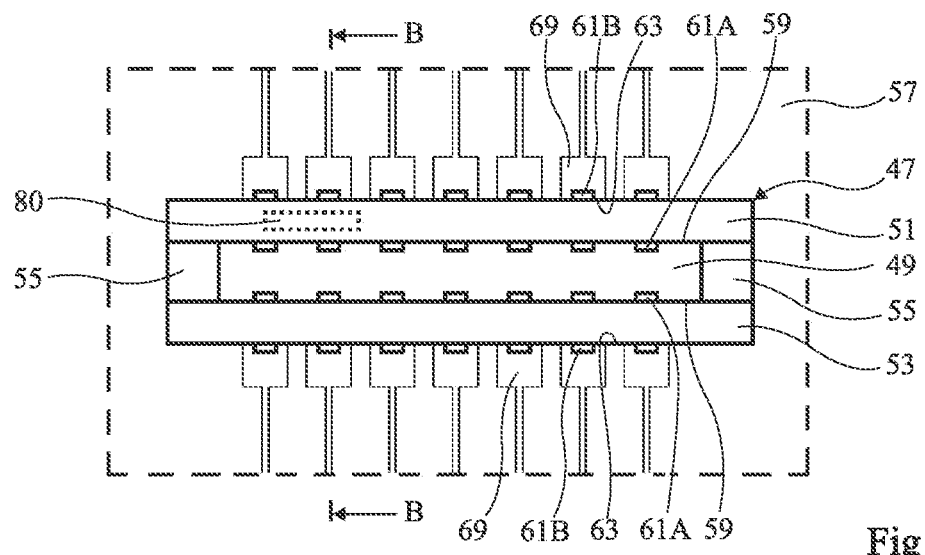
FIGS. 3A and 3B are respective simplified top and perspective views of an embodiment of an electrical connector element.
Figure 3B:
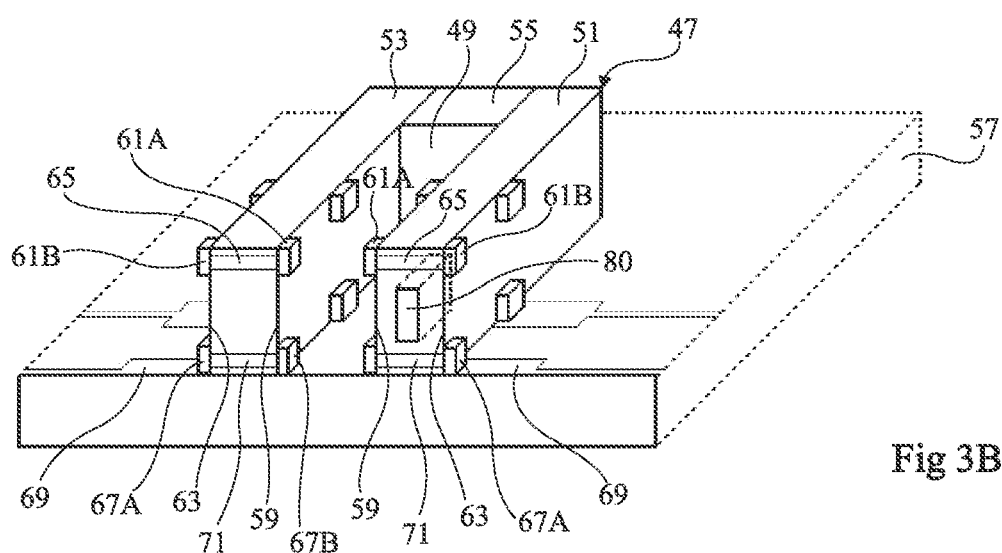

FIGS. 3A and 3B are simplified views, respectively a top and a perspective view, of an embodiment of a connector element, FIG. 3B being a cross-section view along plane B-B of FIG. 3A. The connector element of FIGS. 3A and 3B can be interchanged with the connector element of FIGS. 1A and 1B, and is compatible with the complementary connector element of FIGS. 2A and 2B.

The connector comprises a rectangular frame 47 defining an elongated cavity 49. Each long side of frame 47 is formed of a printed circuit board 51, 53 having at least three levels of metal layers. Each short side of frame 47 is formed of a spacer 55, for example, a portion of an insulating plate or of a printed circuit board, between boards 51 and 53. The lower edge of each board 51, 53 and of each spacer 55 of frame 47 rests on the upper surface of a printed circuit board 57 having the connector element assembled thereon.

Internal surface 59 of each printed circuit board 51, 53 comprises upper contact areas 61A arranged on the upper surface side of surface 59. External surface 63 of each board 51, 53 comprises an upper contact area 61B opposite each upper contact area 61A, two opposite areas 61A and 61B being connected by a through via 65. Contact areas 61A and 61B are intended to be in contact with the contact areas of the complementary connector element.

External surface 63 of each printed circuit board 51, 53 comprises lower contact areas 67A arranged on the side of the lower portion of surface 63 in contact with printed circuit board 57. In this example, lower contact areas 67A have a rim at the same level as lower edges of boards 51 and 53 and are welded to pads 69 of board 57. Internal surface 59 of each board 51, 53 may also comprise a lower contact area 67B opposite each lower contact area 67A, two opposite lower contact areas 67A and 67B being connected by a through via 71. Preferably, according to one embodiment, vias 71 are open along their entire length at the level of the lower edges 51 and 53 such that they may be welded to pads 69 of printed circuit board 57. In this case, the surface area of board 57 may be decreased.

Lower contact areas 67A and 67B of a board 51, 53 are connected to upper contact areas 61A and 61B by conductive paths, not shown, formed on board 51, 53. In an embodiment, spacers 55 are printed circuit board portions comprising conductive paths which enable to connect contact areas 61A, 61B, 67A, and 67B of printed circuit board 51 to contact areas of printed circuit board 53.

The connector element of FIGS. 3A and 3B may have dimensions similar to those of the connector of FIGS. 1A and 1B, and be interchangeable therewith. The connector element of FIGS. 3A and 3B will for example have the following dimensions:
width of upper contact areas 61A and 61B: 200 µm;
spacing between two contact areas 61A or 61B: 150 µm;
thickness of printed circuit boards 51, 53: 0.25±0.1 mm;
thickness of spacers 55 between boards 51 and 53: 0.5±0.1 mm; and
height of boards 51, 53, and of spacers 55: 1.3±0.1 mm.

The dimensions of upper contact areas 61A and 61B, of boards 51 and 53, and of the spacers 55 described above are compatible with existing printed circuit board manufacturing methods.

A connector element interchangeable with the connection element of FIGS. 1A and 1B has been described in relation with FIGS. 3A and 3B. Advantage may also be taken from the use of printed circuit boards to form a miniaturized connector element. Indeed, techniques associated with the use of printed circuit boards enable the forming of smaller and closer contact areas than techniques associated with the use of metal strips. As an example, each contact area 61A, 61B, 67A, and 67B may be a square pad with a side length from 100 to 200 µm, for example, 150 µm, and the space separating two adjacent contact areas 61A, 61B, 67A, or 67B may be in the range from 50 to 150 µm, for example, 100 µm. In the case where the connector element of FIGS. 3A and 3B is miniaturized, the complementary element may then also be formed from printed circuit boards.

As shown in FIGS. 3A and 3B, an advantage of the connector element described in relation with these drawings is that one or a plurality of integrated circuit chips 80 may be arranged in one and/or the other of boards 51 and 53 where the terminals of chips 80 are connected to contact areas 61A, 61B, 67A, and 67B by conductive paths of boards 51, 53. Chips 80 enable association of functions such as filters or overvoltage protections with the connector. Thus, assembling components on printed circuit board 57 around the connector element associated with such functions is not necessary. As a result, the dimensions of printed circuit board 57 may be decreased, which is particularly advantageous in the case where board 57 is part of a mobile electronic device.

Figure 4:
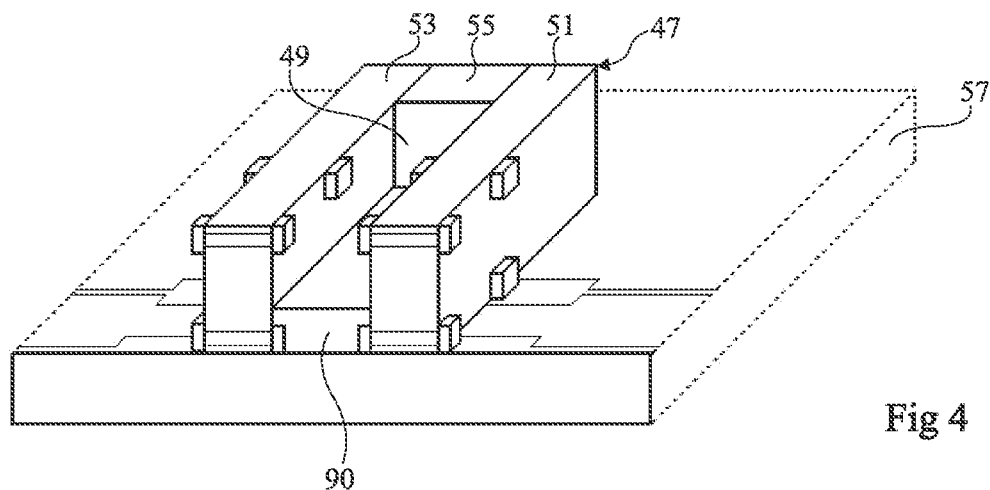
FIG. 4 is a perspective cross-section view of an alternative embodiment of the electrical connector element of FIGS. 3A and 3B.

FIG. 4 is a simplified perspective cross-section view showing an alternative embodiment of the electrical connector element of FIGS. 3A and 3B, the portion of the connector element shown in FIG. 4 corresponding to that shown in FIG. 3B. In this variation, frame 47 of the connector element is closed on the side of printed circuit board 90, which increases the strength of the frame 47, and thus of the strength of the connector element.

Plate 90 for example is a portion of a plate of an insulating material. Plate 90 may also be a portion of a printed circuit board and, in the case where spacers 55 also are printed circuit board portions, spacers 55 and plate 90 may be portions of a same board.

Specific embodiments have been described in relation with FIGS. 3A, 3B, and 4. Various alterations, modifications, and improvements will occur to those skilled in the art. In particular, the previously-described connector elements may be mounted on a connection strip, a user interface, and more generally on any support comprising metal tracks.

The short sides of the frame of the previously-described connector elements define a rectangular frame with the long sides. The short sides may be oblique or rounded.

It will be within the abilities of those skilled in the art to adapt the shape, the dimensions, and the layout of the contact areas of the printed circuit boards. Boards 51 and 53 may for example have no lower contact areas 67B.

Other functions than those previously indicated may be associated with the connector due to the integrated circuit chips arranged in the printed circuit boards of one of the connector elements, for example, amplifiers or synchronization devices.

Various embodiments with different variations have been described. It should be noted that those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An electrical connector, comprising:
    a frame delimiting an elongated open cavity and having two parallel long sides including contact areas configured to contact corresponding contact areas of a complementary electrical connector, wherein each of the two parallel long sides is formed of a multilayer printed circuit board wherein at least one of the multilayer printed circuit boards includes at least three metal layers.

2. The electrical connector of claim 1, wherein at least one integrated circuit chip is arranged in the multilayer printed circuit board of at least one of said parallel long sides.

3. The electrical connector of claim 1, wherein the frame further comprises two spacers disposed between the two parallel long sides of the frame.

4. The electrical connector of claim 3, wherein each of the two spacers is a printed circuit board portion.

5. The electrical connector of claim 1, further comprising a support including a plurality of conductive pads, wherein each of the multilayer printed circuit boards includes a plurality of connection areas contacting the plurality of conductive pads.

6. The electrical connector of claim 5, wherein the plurality of connection areas of each multilayer printed circuit board includes a rim at a level of an edge of the respective multilayer printed circuit board contacting the support.

7. The electrical connector of claim 6, wherein:
    an external surface of each multilayer printed circuit board comprises a plurality of first connection areas;
    an internal surface of each multilayer printed circuit board comprises a plurality of second connection areas; and
    each first connection area is disposed opposite a corresponding second connection area and is connected to the opposite corresponding second connection area by a first through via.

8. The electrical connector of claim 7, wherein the first through vias of each multilayer printed circuit board are open at the level of the edge of the respective multilayer printed circuit board and contacting the support.

9. The electrical connector of claim 1, wherein the frame is rectangular.

10. The electrical connector of claim 1, wherein a plate closes a side of the frame configured to contact a support.

11. An electrical connector, comprising:
    a frame delimiting an elongated open cavity and having two parallel long sides including contact areas configured to contact corresponding contact areas of a complementary electrical connector, wherein each of the two parallel long sides is formed of a multilayer printed circuit board, wherein:
    an internal surface of each multilayer printed circuit board comprises first contact areas;
    an external surface of each multilayer printed circuit board comprises second contact areas; and
    each first contact area being electrically connected to a corresponding second contact area by a via.

12. The electrical connector of claim 11 wherein the via is a through via and each first contact area is disposed opposite the corresponding second contact area and is connected thereto by the through via.

13. An electrical connector, comprising:
    a first printed circuit board;
    a frame supported by the first printed circuit board and delimiting an elongated open cavity, the frame comprising a first long side and a second long side spaced apart and parallel to the first long side, each of the first and second long sides including contact areas configured to contact corresponding contact areas of a complementary electrical connector, wherein the first long side is formed of a first multilayer printed circuit board and the second long side is formed of a second multilayer printed circuit board, each of the first and second multilayer printed circuit boards comprising at least three metal layers.

14. The electrical connector of claim 13, wherein the frame further comprises a pair of parallel short sides each formed of a spacer.

15. The electrical connector of claim 14, wherein the spacer is a portion of an insulating plate.

16. The electrical connector of claim 14, wherein the spacer is a printed circuit board portion.

17. The electrical connector of claim 16, wherein the frame further comprises a plate enclosing a side of the frame contacting the first printed circuit board.

18. The electrical connector of claim 17, wherein the plate comprises a second circuit board and the printed circuit board portion is a portion of the same second circuit board.

19. The electrical connector of claim 13, wherein:
    an internal surface of each the first and second multilayer printed circuit boards comprises first contact areas;
    an external surface of each of the first and the second multilayer printed circuit boards comprises second contact areas; and each first contact area is disposed opposite a corresponding second contact area and is connected to the opposite corresponding second contact area by a through via.

20. The electrical connector of claim 13, further comprising at least one integrated circuit chip arranged in at least one of the first and the second multilayer printed circuit boards.

21. An electrical connector, comprising:
a support printed circuit board having a generally planar surface;
a frame delimiting an elongated open cavity comprising:
a first printed circuit board electrically connected to the support printed circuit board and supported on edge by the generally planar surface of the support printed circuit board and forming a first long side of the frame;
a second printed circuit board electrically connected to the support printed circuit board and supported on edge by the generally planar surface of the support printed circuit board and forming a second long side of the frame disposed opposite the elongated open cavity from the first printed circuit board; and
each of the first and second printed circuit boards including contact areas configured to contact corresponding contact areas of a complementary electrical connector.

22. The electrical connector of claim 21 wherein each of the first and second printed circuit boards comprise at least three metal layers.

23. The electrical connector of claim 21 wherein the contact areas of each of the first and second printed circuit board include an inner contact area disposed on an inner surface of the respective printed circuit board and an outer contact area disposed on an outer surface of the respective printed circuit board electrically connected to the inner contact area by a through via.

24. An electrical connector, comprising:
a support printed circuit board having a generally planar surface;
a frame delimiting an elongated open cavity comprising:
a first printed circuit board electrically connected to the support printed circuit board and supported on edge by the generally planar surface of the support printed circuit board and forming a first long side of the frame;
a second printed circuit board electrically connected to the support printed circuit board and supported on edge by the generally planar surface of the support printed circuit board and forming a second long side of the frame disposed opposite the elongated open cavity from the first printed circuit board; and
each of the first and second printed circuit boards including contact areas configured to contact corresponding contact areas of a complementary electrical connector; and
the contact areas of each of the first and second printed circuit board include an inner contact area disposed on an inner surface of the respective printed circuit board and an outer contact area disposed on an outer surface of the respective printed circuit board electrically connected to the inner contact area by a through via, each through vias being open at the generally planar surface of the support printed circuit board.

* * * * *